US010869415B1

(12) United States Patent
Embleton et al.

(10) Patent No.: US 10,869,415 B1
(45) Date of Patent: Dec. 15, 2020

(54) SYSTEM AND METHOD FOR OPERATING ELECTROMAGNETICALLY ISOLATED DEVICE

(71) Applicant: Dell Products L.P., Hopkinton, MA (US)

(72) Inventors: Steven Embleton, Austin, TX (US); Ben John Sy, Austin, TX (US); Eric Michael Tunks, Austin, TX (US)

(73) Assignee: Dell Products L.P., Hopkinton, MA (US)

( * ) Notice: Subject to any disclaimer, the term of this patent is extended or adjusted under 35 U.S.C. 154(b) by 40 days.

(21) Appl. No.: 16/516,321

(22) Filed: Jul. 19, 2019

(51) Int. Cl.
| *G06F 1/16* | (2006.01) |
| *H05K 5/00* | (2006.01) |
| *H05K 7/00* | (2006.01) |
| *H05K 9/00* | (2006.01) |
| *H04B 15/02* | (2006.01) |

(52) U.S. Cl.
CPC ......... *H05K 9/0009* (2013.01); *G06F 1/1656* (2013.01); *H04B 15/02* (2013.01); *H05K 9/0018* (2013.01)

(58) Field of Classification Search
CPC .. H05K 9/0009; H05K 9/0018; G06F 1/1656; H04B 15/02
See application file for complete search history.

(56) References Cited

U.S. PATENT DOCUMENTS

| 4,785,136 A | 11/1988 | Mollet et al. |
| 4,871,220 A | 10/1989 | Kohin |
| 5,049,701 A | 9/1991 | Vowles et al. |
| 5,084,802 A * | 1/1992 | Nguyenngoc ........ H05K 9/0062 174/368 |
| 5,250,752 A | 10/1993 | Cutright |
| 5,294,748 A | 3/1994 | Schwenk et al. |
| 5,323,298 A | 6/1994 | Shatas et al. |
| 5,545,844 A | 8/1996 | Plummer, III et al. |
| 6,068,009 A | 5/2000 | Paes et al. |
| 6,225,554 B1 | 5/2001 | Trehan et al. |
| 6,242,690 B1 | 6/2001 | Glover |
| 6,613,977 B1 | 9/2003 | Fowler |
| 7,035,087 B2 | 4/2006 | Tan |
| 7,371,977 B1 | 5/2008 | Preonas |
| 8,530,756 B1 | 9/2013 | Winch |
| 8,642,900 B2 | 2/2014 | Nordling et al. |

(Continued)

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

(Continued)

*Primary Examiner* — Anthony M Haughton
(74) *Attorney, Agent, or Firm* — Chamberlain, Hrdlicka, White, Williams & Aughtry

(57) ABSTRACT

A system for providing electromagnetic interference (EMI) suppression includes a data processing device. The data processing device includes a payload module that suppresses EMI from an internal volume to an ambient environment by greater than 90 decibels; the internal volume adapted to house EMI emitting devices that generate EMI; and an input control system disposed within the internal volume. The input control system includes a command input device translatable along axes and adapted to mechanically input commands into the EMI emitting devices.

20 Claims, 9 Drawing Sheets

(56) References Cited

U.S. PATENT DOCUMENTS

| | | | |
|---|---|---|---|
| 8,760,859 B2 | 6/2014 | Fuchs et al. | |
| 8,969,738 B2 | 3/2015 | Ross | |
| 9,095,045 B2 | 7/2015 | Rojo et al. | |
| 9,370,132 B2 | 6/2016 | Coppola | |
| 9,497,894 B1 | 11/2016 | Ramsey | |
| 9,549,480 B1* | 1/2017 | Besterman | H05K 5/0204 |
| 9,642,290 B2 | 5/2017 | Anderson et al. | |
| 9,930,816 B2 | 3/2018 | Winch et al. | |
| 10,420,258 B1 | 9/2019 | Rahilly et al. | |
| 10,477,740 B2 | 11/2019 | Coppola | |
| 10,477,741 B1 | 11/2019 | Bae et al. | |
| 10,520,532 B2 | 12/2019 | Lee | |
| 10,542,642 B2 | 1/2020 | Babhadiashar et al. | |
| 10,575,443 B2 | 2/2020 | Woodbury, II et al. | |
| 2002/0064035 A1 | 5/2002 | Mair et al. | |
| 2003/0174474 A1 | 9/2003 | Mair et al. | |
| 2007/0105445 A1 | 5/2007 | Manto et al. | |
| 2009/0021925 A1* | 1/2009 | Heimann | H05K 9/0062 361/818 |
| 2009/0095523 A1* | 4/2009 | Stevenson | H05K 9/0062 174/565 |
| 2010/0208433 A1* | 8/2010 | Heimann | H04Q 1/03 361/724 |
| 2010/0285636 A1 | 11/2010 | Chen | |
| 2010/0319981 A1 | 12/2010 | Kapusta et al. | |
| 2011/0232956 A1 | 9/2011 | Ramsey | |
| 2012/0044653 A1 | 2/2012 | Morris et al. | |
| 2012/0178364 A1 | 7/2012 | Dobyns | |
| 2013/0194772 A1* | 8/2013 | Rojo | H04Q 1/116 361/818 |
| 2014/0138388 A1 | 5/2014 | Synnestvedt | |
| 2014/0368821 A1 | 12/2014 | Gazaway et al. | |
| 2015/0271959 A1 | 9/2015 | Chen et al. | |
| 2015/0368423 A1 | 12/2015 | Yamauchi et al. | |
| 2015/0373869 A1 | 12/2015 | Macerini et al. | |
| 2016/0182130 A1 | 6/2016 | Ahmed et al. | |
| 2016/0372948 A1 | 12/2016 | Kvols | |
| 2016/0381818 A1 | 12/2016 | Mills et al. | |
| 2018/0257334 A1 | 9/2018 | Motoyanagi et al. | |
| 2019/0050030 A1* | 2/2019 | Baum | G06F 1/189 |
| 2019/0056439 A1 | 2/2019 | Lee | |
| 2019/0159371 A1 | 5/2019 | Grinsteinner | |
| 2019/0230828 A1* | 7/2019 | Murch | H01R 25/162 |
| 2019/0304922 A1 | 10/2019 | Maruthamuthu et al. | |
| 2019/0353356 A1 | 11/2019 | Fischer | |
| 2019/0379183 A1* | 12/2019 | Winsor | H05K 9/009 |
| 2020/0187394 A1* | 6/2020 | Murugesan | G06F 30/23 |
| 2020/0187578 A1 | 6/2020 | Sadato | |

OTHER PUBLICATIONS

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

* cited by examiner

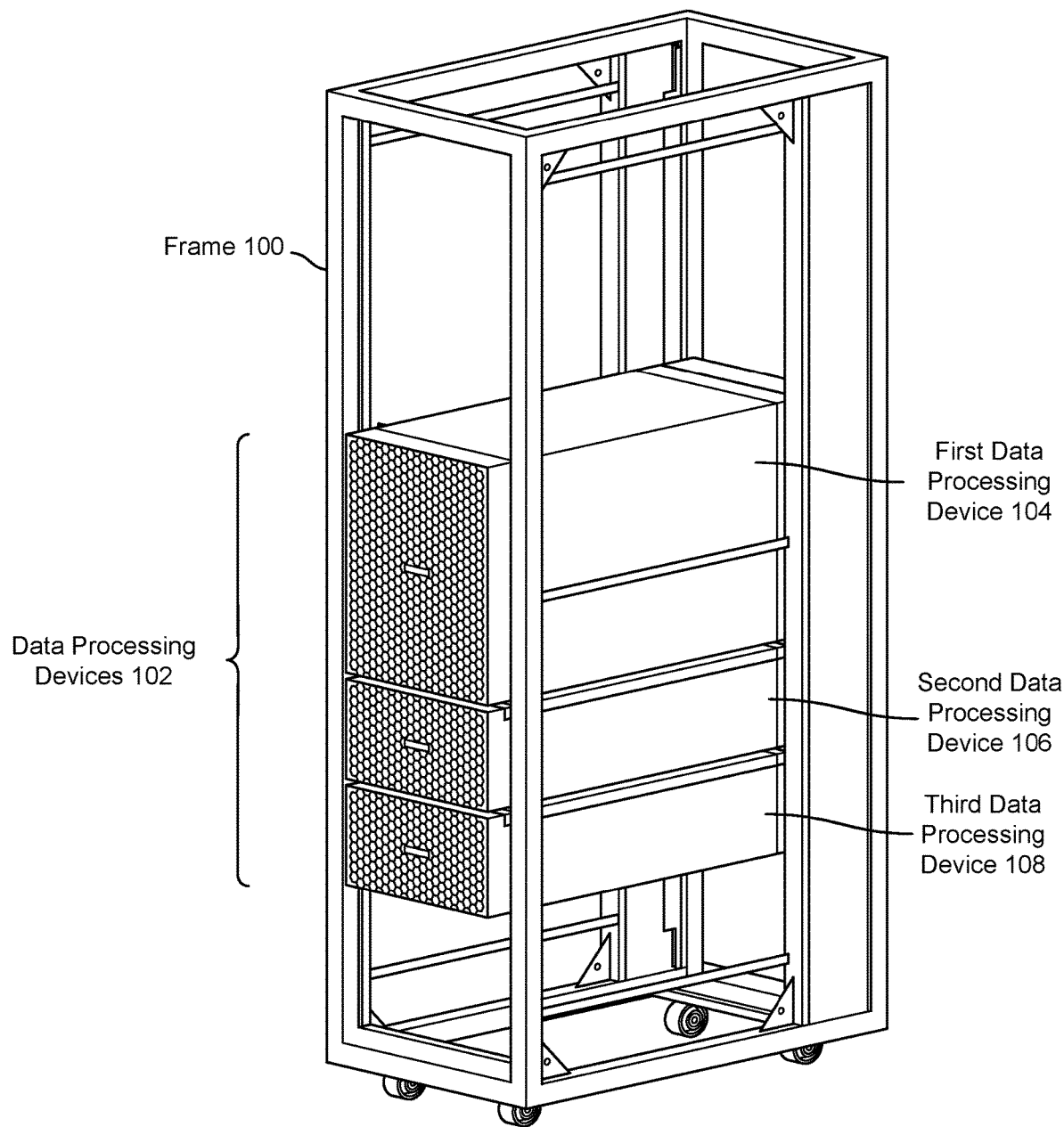
FIG. 1.1

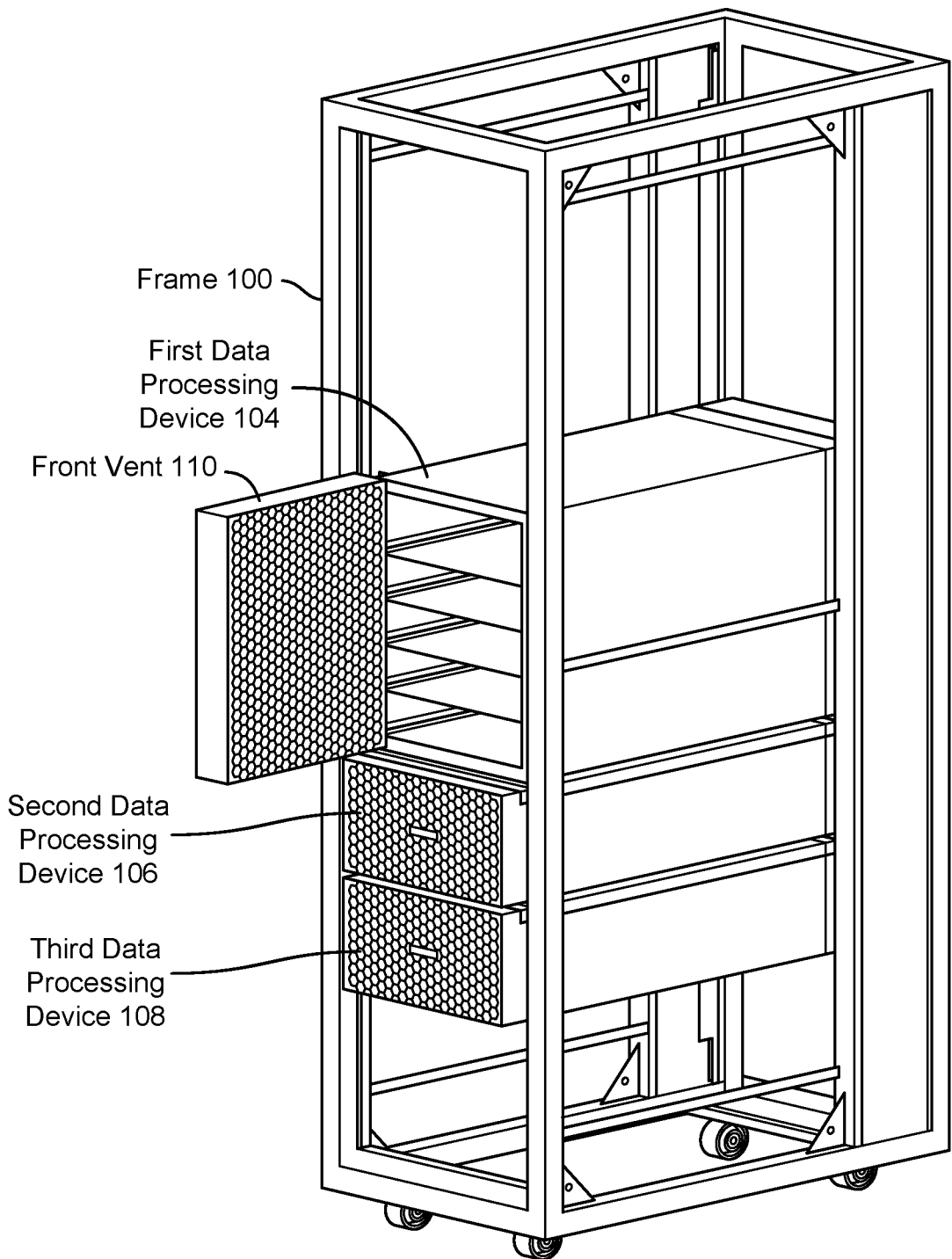
FIG. 1.2

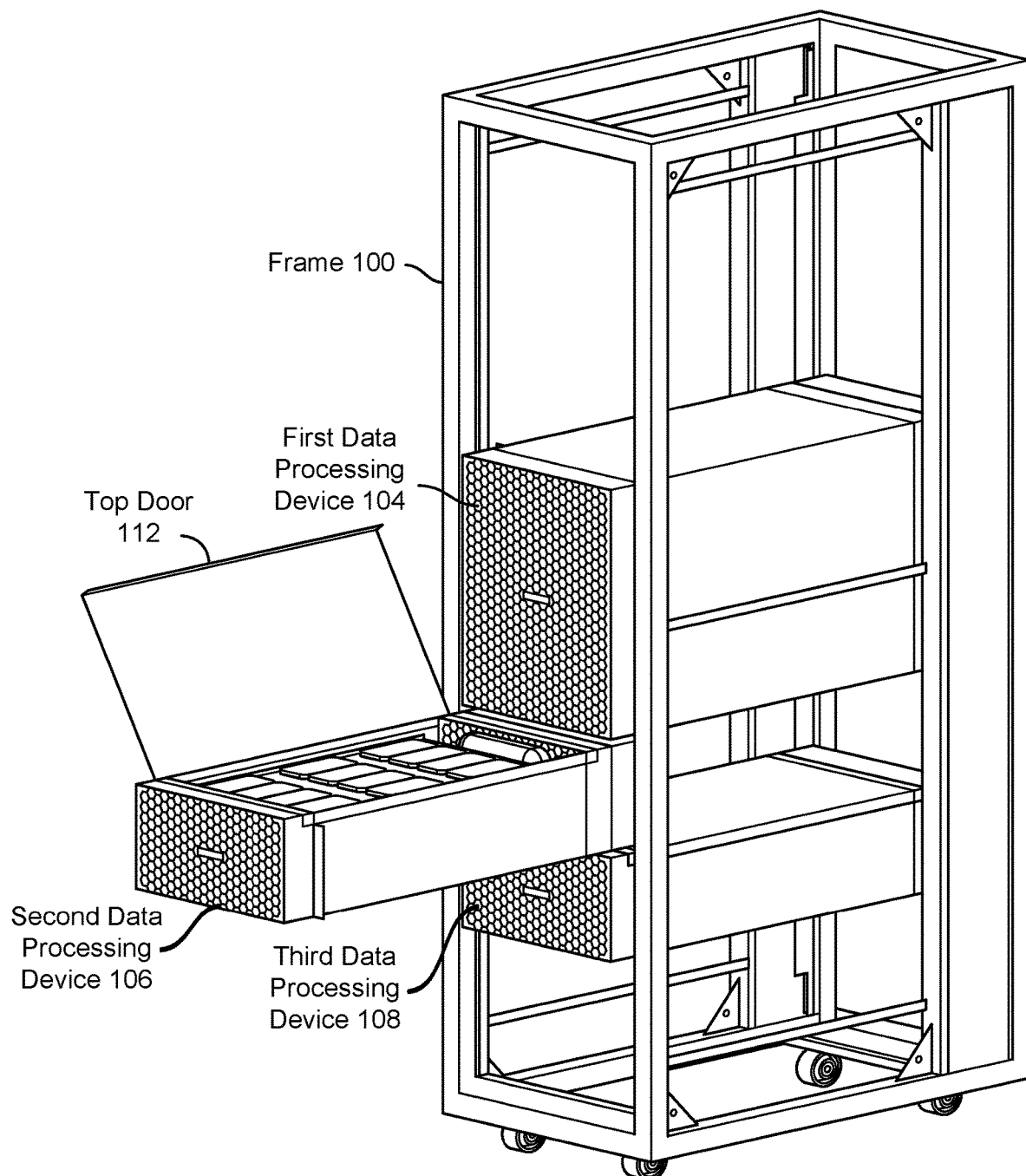
FIG. 1.3

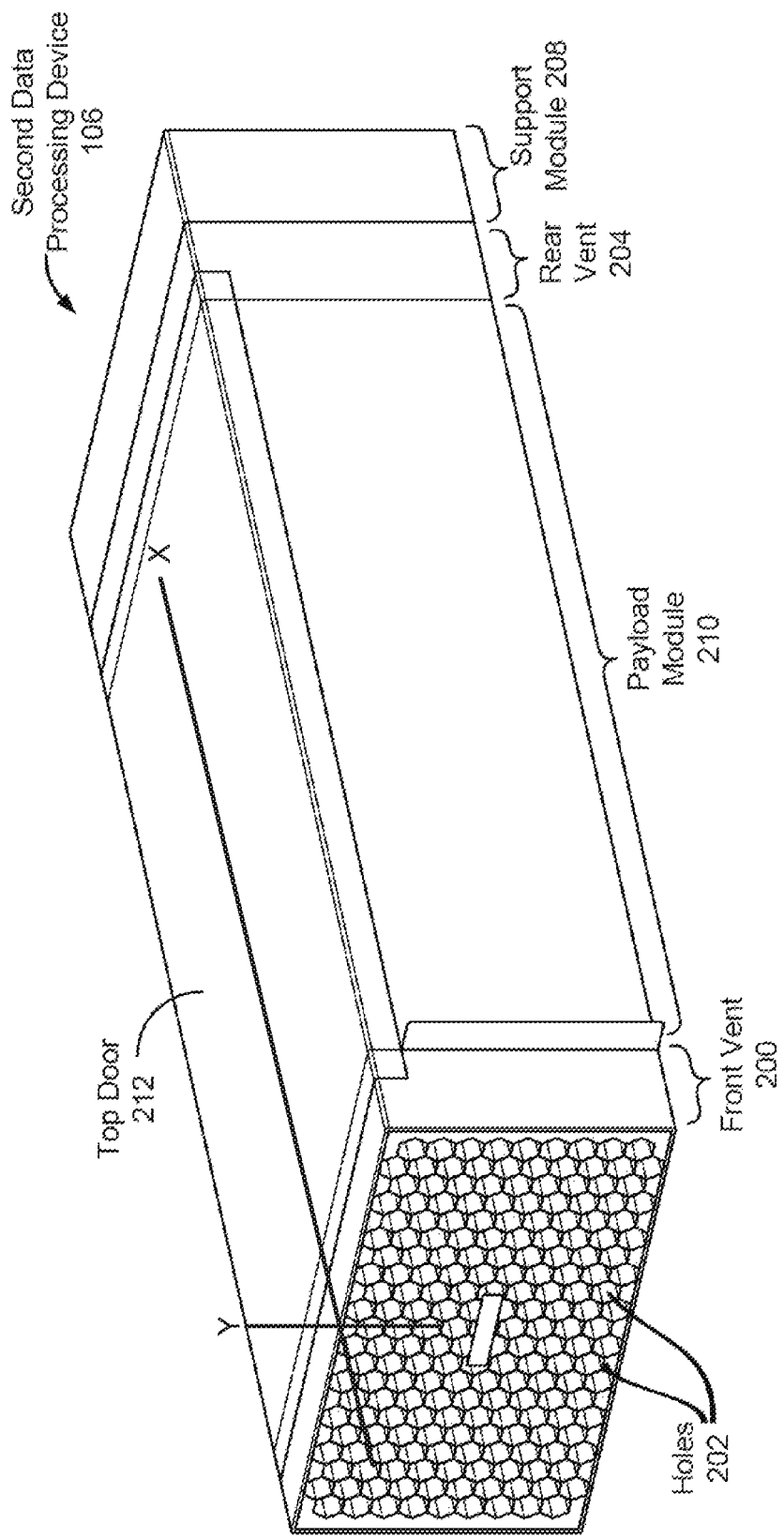
FIG. 2.1

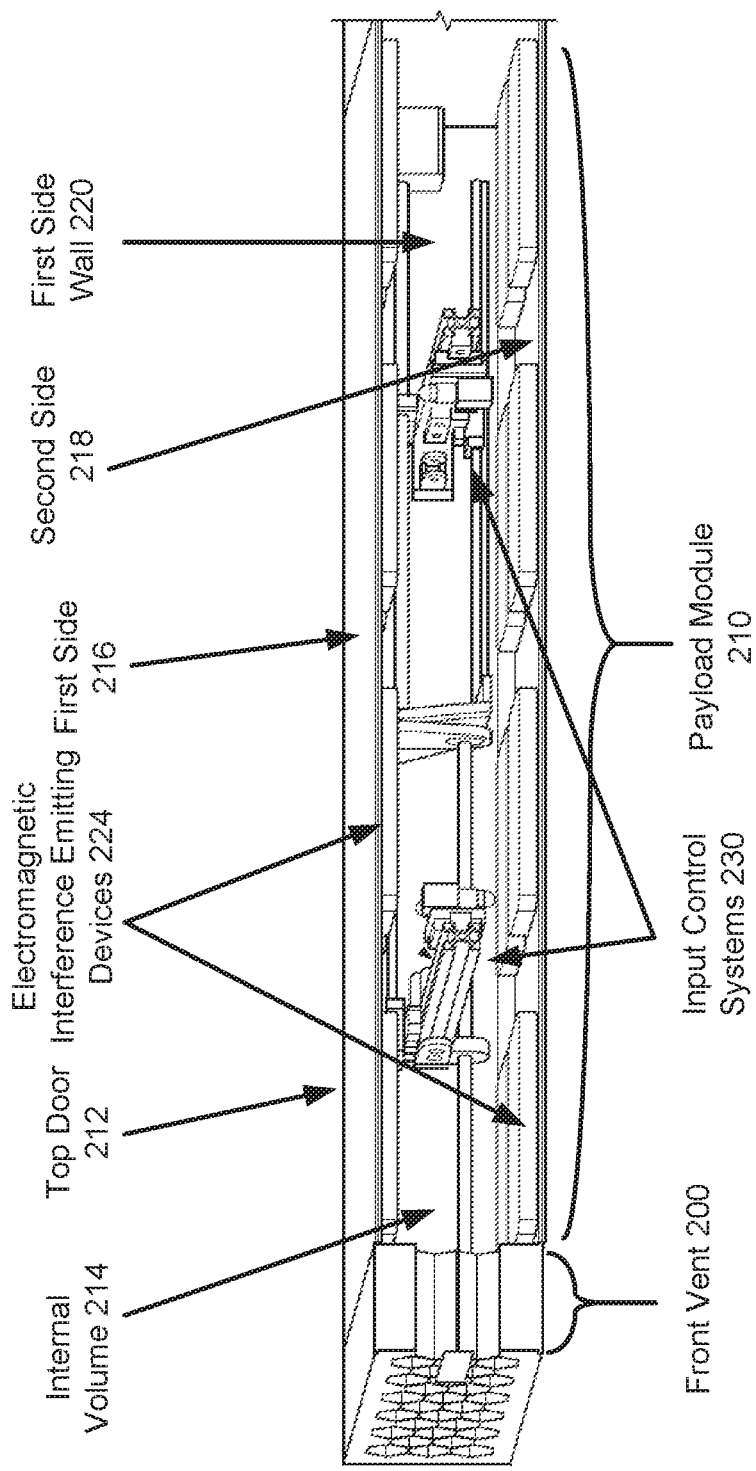
FIG. 2.2

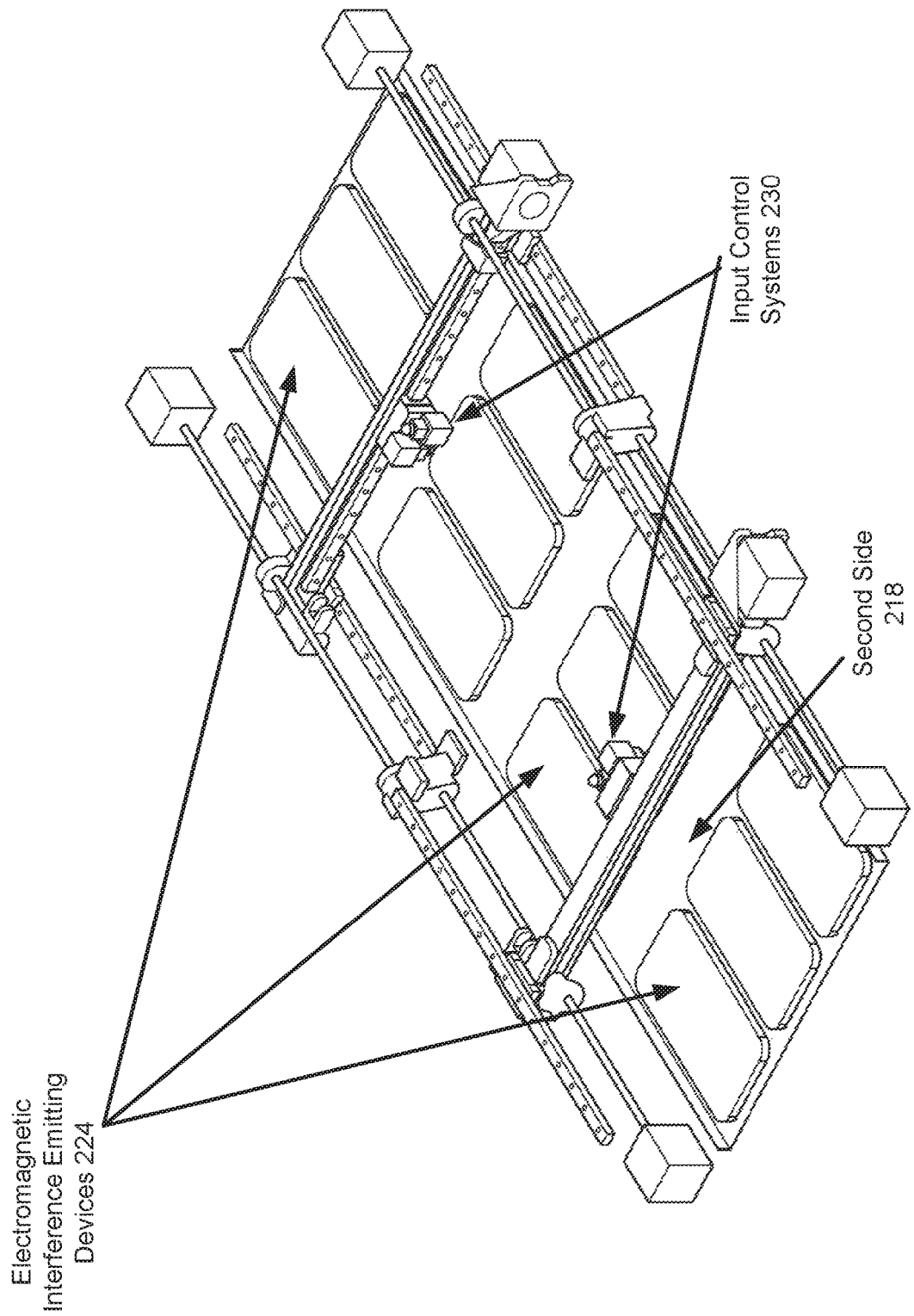
FIG. 2.3

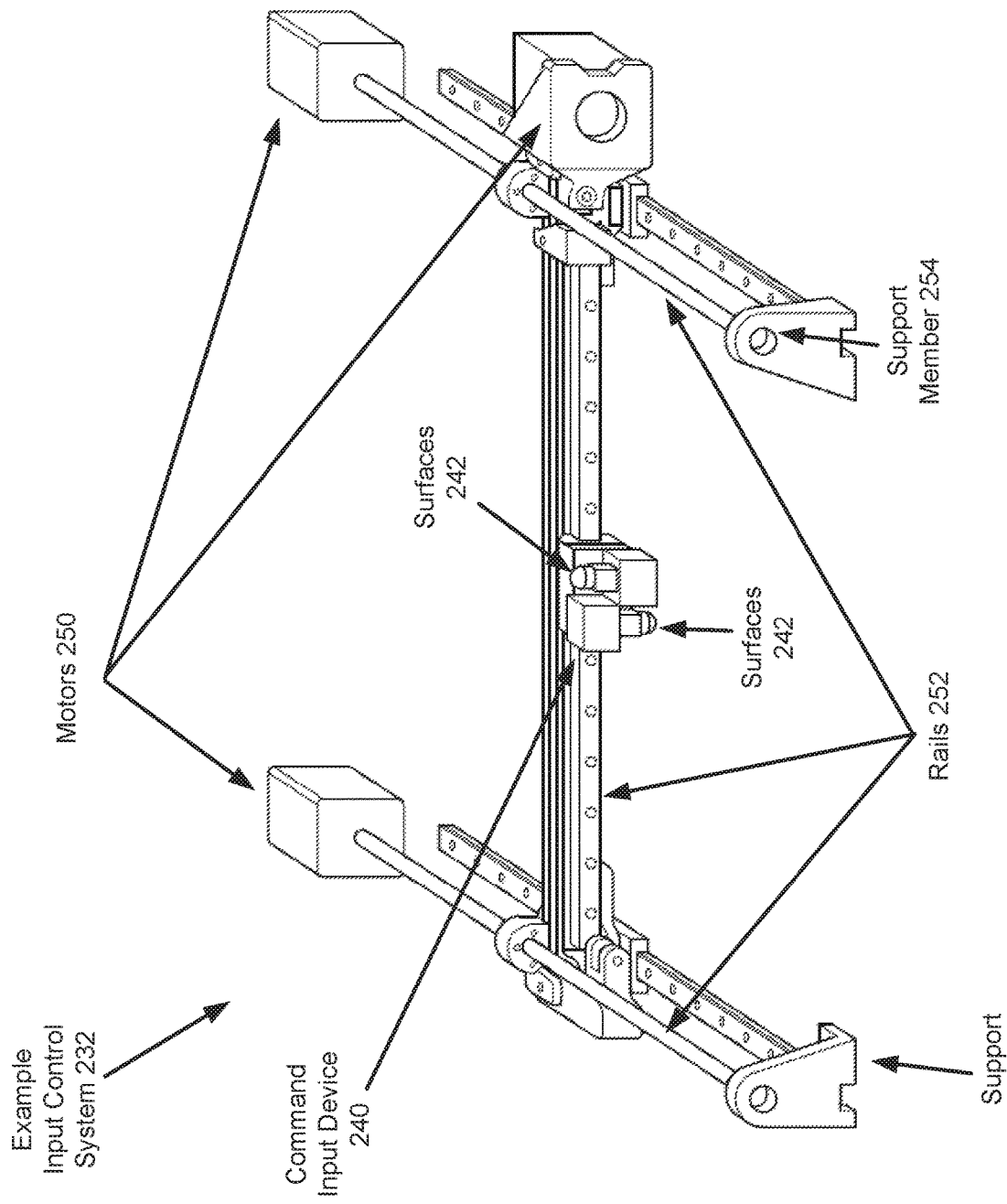
FIG. 2.4

SYSTEM AND METHOD FOR OPERATING ELECTROMAGNETICALLY ISOLATED DEVICE

BACKGROUND

High density environment may include devices that are tightly packed together. In other words, the device may be physically close to each other. Such an environment present numerous challenges relating to thermal management, mechanical positioning and orienting of devices, and electrical concerns related to power and operation of such devices.

SUMMARY

In one aspect, a system for providing electromagnetic interference (EMI) suppression in accordance with one or more embodiments of the invention includes a data processing device. The data processing device includes a payload module that suppresses EMI from an internal volume to an ambient environment by greater than 90 decibels; the internal volume adapted to house EMI emitting devices that generate EMI; and an input control system disposed within the internal volume. The input control system includes a command input device translatable along axes and adapted to mechanically input commands into the EMI emitting devices.

In one aspect, a method for managing electromagnetic interference (EMI) in accordance with one or more embodiments of the invention includes operating EMI emitting devices that emit EMI during operation while disposed in an EMI suppressed internal volume of a data processing device; making a determination that the internal volume is in an EMI suppressed state; based on the determination, performing an action set including inputting commands into the EMI emitting devices via a command input device positioned in the EMI suppressed internal volume while the EMI emitting devices are emitting EMI. The command input device inputs the commands via mechanical actuation.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention, FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a data processing device in accordance with one or more embodiments of the invention.

FIG. 2.2 shows a first cut-view diagram of the data processing device of FIG. 2.1.

FIG. 2.3 shows a second cut-view diagram of the data processing device of FIG. 2.1.

FIG. 2.4 shows a perspective view of an input control system utilized within the data processing device of FIG. 2.1.

DETAILED DESCRIPTION

Figure 3:
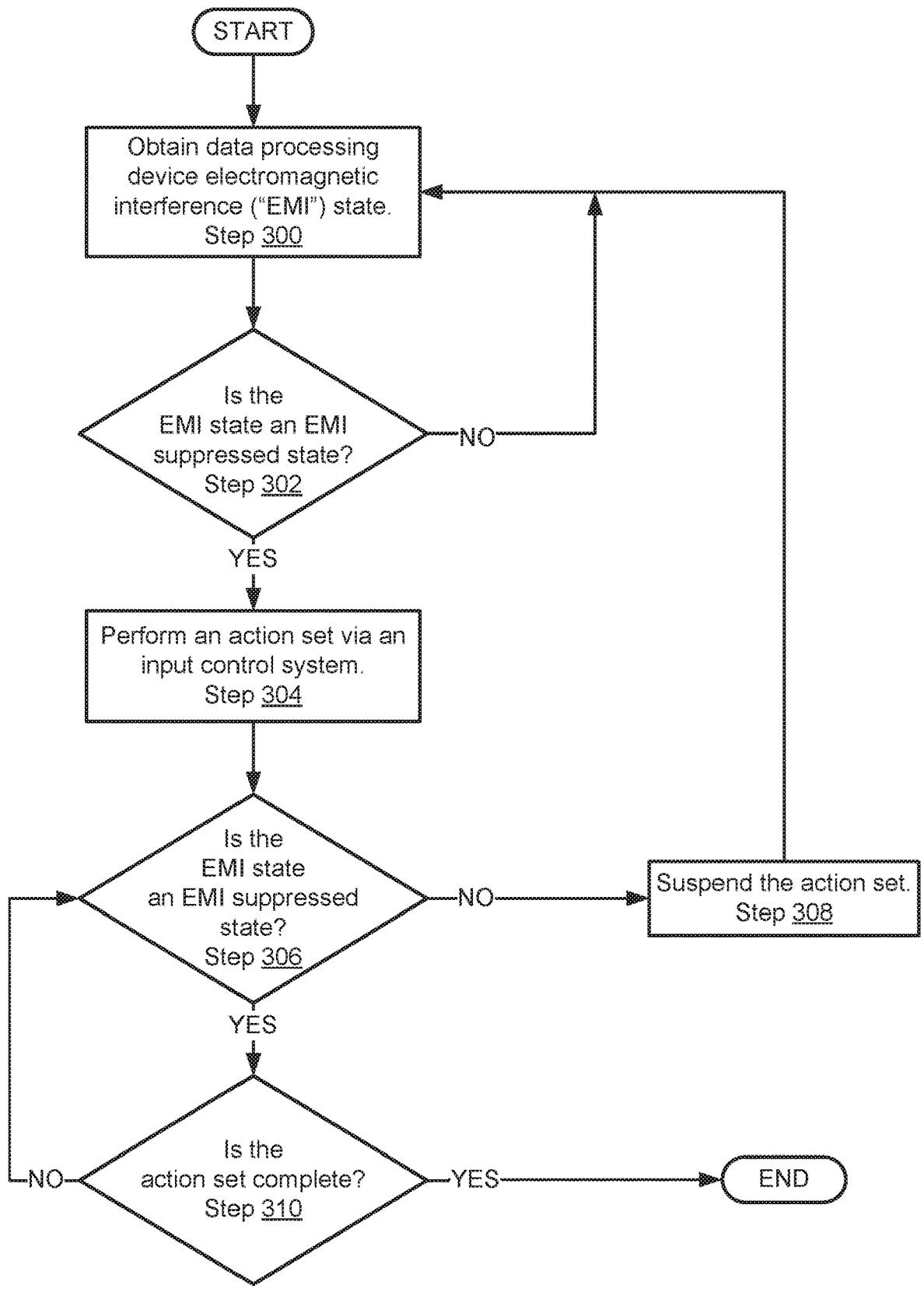
FIG. 3 shows a flowchart of a method of providing electromagnetic interference management services in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices. The data processing devices may isolate the electromagnetic interference emitting devices from the ambient environment proximate to the data processing device by at least 90 decibels. The data processing devices may also facilitate the insertion, removal, and/or modification of electromagnetic interference emitting devices while maintaining the electromagnetic isolation of the aforementioned devices from the ambient environment. By doing so, such electromagnetic interference emitting device may be utilized, in a high-density setting, while mitigating the potential impact on the high-density environment of inclusion of such devices.

In addition, any number of input control systems may be included within the internal volume of the data processing device. The input control systems may be operable to input commands, such as tactile commands, into the electromagnetic interference emitting devices (and/or other devices disposed in the internal volume) while the data processing device electromagnetically isolates the electromagnetic interference emitting devices (and/or other devices) from the ambient environment proximate to the data processing device by at least 90 decibels. By doing so, functionality of the electromagnetic interference emitting devices may be invoked via mechanical actuation to cause the tactile commands to be input while the electromagnetic interference emitting devices are electromagnetically isolated.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one of the data processing devices (102). The system illustrated in FIG. 1.1 may manage the electromagnetic interference generated by the one or more electromagnetic interference emitting devices by (i) limiting the space in which electromagnetic interference is allowed to propagate freely and (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment around the data processing devices (102) and/or other locations by at least 90 decibels or another suitable level of suppression. The suitable level of suppression may be between 15-30 decibels, 30-45 decibels, 45-60 decibels, 60-75 decibels, 75-90 decibels, or 90-120 decibels. Different suitable levels of suppression may be provided by the data processing devices (102) without departing from the invention. In some embodiments of the invention, the data processing devices (102) provide at least 35 decibels of attenuation (e.g., electromagnetic isolation).

For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.). Such devices may emit electromagnetic radiation for wireless communication purposes or other purposes without departing from the invention.

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using of any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 4.

A chassis may be a mechanical device adapted to (i) facilitates attachment of the computing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the computing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices within a data processing device.

To house the one or more electromagnetic interference emitting devices, the chassis may include one or more internal volumes. The internal volumes may have a shape or other characteristics that facilitate disposing of the one or more electromagnetic interference emitting devices within the data processing device.

In one or more embodiments of the invention, the one or more internal volumes of the computing devices may be adapted to restrict propagation of electromagnetic interference emitted by the electromagnetic interference emitting devices. For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated) from propagating from within the data processing devices (102) into the ambient environment surrounding the respective data processing devices (102).

In another example, one or more portions of the chassis that bound the one or more internal volumes may be formed in a manner that filters electromagnetic radiation when electromagnetic radiation passes through the portions of the chassis. For example, a portion of the chassis that bounds the one or more internal volumes may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more internal volumes may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other lossy metals. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

To provide thermal management services to the computing devices and/or the electromagnetic interference emitting devices, the data processing devices (102) may facilitate the flow of gas proximate to the computing devices and/or electromagnetic interference emitting devices. By doing so, the thermal state (i.e., temperature) of the aforementioned devices may be regulated. The gas may be air or another type/combination of gasses obtained from any source.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices. The system of FIG. 1.1 may further include a third data processing device (108).

As discussed above, the data processing devices (102) may house electromagnetic interference emitting devices. When so housed, the electromagnetic interference emitting devices may operate, thereby generating electromagnetic interference. At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices. For example, the different portions of the data processing devices (102) may be adapted to rotate, translate, or otherwise move with respect to the remaining portions of the data processing devices (102). The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition and/or removal of electromagnetic interference emitting devices.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. For example, the second data processing device (106) may be mounted to the frame (100) via rails that enable the second data processing device (106) to translate with respect to the frame (100).

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services.

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.3 show diagrams of the second data processing device (206) in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices (224) disposed within the second data processing device (106). To do so, the second data processing device (106) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around second data processing device (106) via the front vent (200).

In one or more embodiments of the invention, the front vent (200) is a rectangular structure formed with holes (202) that enables gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause cool gas to flow into the second data processing device (106) via the front vent (200) and exhaust gas out a second side of the second data processing device (106) (e.g., out of the support module (208)). Alternatively, the second data processing device (106) may cause a reverse gas flow, of that discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation.

For example, electromagnetic radiation of the electromagnetic interference impinging on the top door, the sides, and the bottom of the second data processing device may be locked (i.e., reflected towards the internal volume) within the internal volume rather than being allowed to propagate to the ambient environment surrounding the internal volume. Electromagnetic radiation of the electromagnetic interference impinging on the front vent and the rear vent may, similarly, be locked (i.e., reflected towards the internal volume) within the internal volume and/or attenuated by at least 90 decibels as the electromagnetic radiation propagates through the vents and into the ambient environment surrounding the second data processing device. Consequently, the electromagnetic interference emitting devices (224) disposed within the internal volume of the second data processing device may be isolated from the ambient environment surrounding the second data processing device by at least 90 decibels.

To facilitate the flow of gas between the ambient environment and the internal volume of the second data processing device (106), the size, position, number, shape, and/or other characteristics of the holes (202) may be selected to meet gas flow requirements for thermal management purposes while still enabling electromagnetic interference to be contained within internal volumes of the data processing devices.

The rear vent (204) may be similar to the front vent (200). For example, the rear vent (204) may provide similar attenuation/restriction of propagation of electromagnetic radiation while enabling gas to flow between internal volumes of the second data processing device.

The payload module (210) may be a physical device for (i) housing electromagnetic interference devices (and/or other types of devices), (ii) housing input control systems, (iii) limiting propagation of electromagnetic interference from internal volumes of the second data processing device (106) to the ambient environment surrounding the second data processing device (106), and (iv) thermally regulating devices disposed within the payload module (210). For additional details regarding the payload module (210), refer to FIGS. 2.2-2.4.

The support module (208) may be a physical device for housing devices that provide services to devices disposed within the payload module (210). For example, the support module (208) may house one or more power supplies, fans, networking devices, and/or computing devices. The aforementioned devices may provide corresponding services to devices disposed in other portions of the second data processing device (106) and/or devices located in other locations (i.e., external to the second data processing device (106)).

The one or more power supplies may supply power to other devices. For example, the power supplies may provide power to electromagnetic interference emitting devices disposed within the payload module and/or other types of devices such as motion control systems, actuators, and/or other devices for interacting with the electromagnetic interference emitting devices and/or other types of devices disposed in the payload module and/or other locations.

The one or more power fans may provide thermal management services to other devices. For example, the fans may regulate the flow of gasses through the second data processing device. By doing so, thermal energy generated by the devices may be removed from the second data processing device.

The one or more power networking devices may provide communication services to other devices. For example, the networking devices may manage network interfaces that enables the electromagnetic interference emitting devices and/or other types of devices disposed within the payload module (210) to communicate with other devices (e.g., computing devices that may be controlling the operation of the electromagnetic interference emitting devices, mechanical devices that may be used to control the electromagnetic interference emitting devices, etc.).

The one or more computing devices may manage the operations of the other entities of the second data processing device (106) and/or other types of devices (such as robotic systems or other types of mechanical devices) for operating the other entities. For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference. For example, the computing devices may send messages to the input control systems to perform predetermined functionality. Such messages, when received by the input control systems may cause the input control systems to enter certain commands into the electromagnetic interference emitting devices.

In another example, the computing devices may send messages to a mechanical system that operates the electromagnetic interference emitting devices. The mechanical system may include a tactile input device that inputs commands to the electromagnetic interference emitting devices via tactile sensors (e.g., mechanically actuated sensors) such as touch sensitive screens of the electromagnetic interference emitting devices.

The computing devices may send such instructions when the electromagnetic interference suppression state of the second data processing device (106) is changed (i.e., when portions of the second data processing device (106) are physically reconfigured) or to invoke other functionality of the electromagnetic interference emitting devices. The computing devices may make such determinations based on any number of sensors (not shown) that monitor the physical configuration of the second data processing device (106) and/or information obtained from the electromagnetic interference emitting devices.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 3. For additional details regarding computing devices, refer to FIG. 4.

To further clarify aspects of embodiments of the invention, a cut-view diagram of the second data processing device (106) in accordance with one or more embodiments of the invention is shown in FIG. 2.2. In FIG. 2.2, the second data processing device (106) has been cut along the X-Y plane illustrated in FIG. 2.1 and a portion, defined by the X-Y plane, has been removed to expose portions of the internal structure of the second data processing device (106).

As seen from FIG. 2.2, the payload module (210) may include an internal volume (214), electromagnetic interference emitting devices (224), and input control systems (230). The internal volume (214) may be used to house devices such as electromagnetic interference emitting devices (224), input control systems (230), supports for such devices, and/or other devices that may provide services to the electromagnetic interference emitting devices and/or other devices.

The internal volume (214) may be bounded, on four sides, by portions of the payload module (210). For example, the internal volume (214) may be bounded by a top door (212) that forms a first side (216), a second side (218), a first side wall (220), and a second side wall (not shown). These four components of the payload module (210) may define a rectangular shape of the internal volume (214).

The internal volume (214) may be further bounded, on a fifth and sixth side, by the front vent (200) and the rear vent (204). The front vent (200) and the rear vent (204) may be on opposite sides of the internal volume (214). By doing so, the front vent (200) and the rear vent (204) may define an gas flow path through the payload module (210). For example, gasses may be able to flow from between the two vents through the internal volume (214). As discussed above, to control such gas flow fans or other gas flow control devices may be disposed in the support module (208). Gas flow control devices may be disposed in other locations (e.g., in the payload module, on an exterior of the front vent (200), etc.) to control the flow of gasses through the payload module (210) without departing from the invention.

While the payload module (210) and internal volume (214) have been illustrated as having a rectangular shape, the aforementioned components may be of different types of shapes without departing from the invention. Further, while the front vent (200) and the rear vent (204) have been described as being disposed on opposite sides of the internal volume (214), the vents may be located at other locations to define gas flow paths of different shapes without departing from the invention. For example, the rear vent (204) may be aligned with the bottom, the top door (212), or the sides (e.g., 216) to define an gas flow path having a turn (rather than being a straight line).

The gas flow path through the internal volume (214) may be of any shape without departing from the invention. The internal volume (214) may include any number of gas flow paths (i.e., the internal volume (214) may be bounded by additional vents other than the front vent (200) and the rear vent (204)).

FIG. 2.2 also shows electromagnetic interference emitting devices (224) disposed on the first side (216) and the second side (218), which may oppose each other. Such devices may have been placed in the internal volume (214) by utilizing the top door (212). Further, the electromagnetic interference emitting devices (224) may be removably coupled to their respective side, such as by adhesive coupling, magnetic coupling, hook and loop coupling, or other removable couplings. In other embodiments of the invention, the electromagnetic interference emitting devices (224) may be removable coupled to their respective side due to friction or other physical forces.

The example disposition of electromagnetic interference emitting devices (224) within the second data processing device illustrated in FIG. 2.3 may be considered to be a in a low-density state. That is, the internal volume is relatively sparsely populated with electromagnetic interference emitting devices (224).

The electromagnetic interference emitting devices (224) may include multiple modes for receiving instructions from other devices. For example, the electromagnetic interference emitting devices (224) may be operably connected to the other devices via any combination of wired and/or wireless connections. In such a scenario, instructions from the other devices may be received via communications provided to the electromagnetic interference emitting devices (224) via the operable connections.

In another example, the electromagnetic interference emitting devices (224) may include sensors for receiving mechanical input. The sensors may be, for example, tactile sensors such as bump switches, capacitive sensors, touch sensitive displays, etc.

To facilitate controlling the operation of the electromagnetic interference emitting devices (224) via mechanical input, the second data processing device may include one or more input control system (230). The input control systems (230) may be physical devices disposed within the internal volume (214) between the first side (216) and the second side (218). The input control systems (230) may be controllable to input commands into the electromagnetic interference emitting devices (224). For example, the input control systems (230) may include one or more surfaces to input tactile commands into the electromagnetic interference emitting devices (224) by physical actuation of corresponding mechanical input sensors of the electromagnetic interference emitting devices (224).

Further, the input control systems (230) may include one or more degrees of freedom to move within the internal volume (214). For example, the input control systems (230) may translate along up to all three Cartesian axes. Any number of input control systems (230) may be disposed within the internal volume (214). For example, there may be one input control system (230) for each electromagnetic interference emitting device (224) or one input control system (230) for multiple electromagnetic interference emitting devices (224).

In such a scenario, the one input control system may mechanically actuate mechanical input sensors of multiple electromagnetic interference emitting devices. To do so, the input control systems (230) may translate toward either the first side (216) or the second side (218) to input commands on electromagnetic interference emitting devices (224) positioned on either of the first side (216) or the second side (218), depending on which of the sides the electromagnetic interference emitting device is disposed.

To further clarify aspects of embodiments of the invention, a perspective view in accordance with one or more embodiments of the invention is provided in FIG. 2.3, where only electromagnetic interference emitting devices (224), the input control systems 230, and the second side (218) are shown (in contrast to FIG. 2.2 which illustrates additional components than those illustrated in FIG. 2.3). For illustration purposes, only the electromagnetic interference emitting devices (224) disposed on the second side (218) are illustrated in FIG. 2.3. When so positioned, the mechanical input sensors of the electromagnetic interference emitting devices may be oriented towards the input control systems (230) and away from the second side (218) on which the devices are disposed.

The input control systems (230) may be disposed proximate to the electromagnetic interference emitting devices (224) and may include physical structures such as rails and motors used to actuate mechanical input sensors of the electromagnetic interference emitting devices (224). Further, the components of the input control systems (230) may be positioned and/or oriented with respect to each other to reduce their occupied space. For example, the input control systems (230) may be oriented oppositely relative to each other to enable some overlap between different components of the adjacent input control systems (230).

To further clarify aspects of embodiments of the invention, a diagram of an example input control system (232) in accordance with one or more embodiments of the invention is shown in FIG. 2.4. As discussed above, the input control systems (230, FIG. 2.3) may facilitate providing instructions to electromagnetic interference emitting devices (224) by mechanically actuating corresponding mechanical input sensors of the electromagnetic interference emitting devices. To do so, the input control system (230) may include a command input device (240) with surfaces (242), motors (250), rails (252), and support members (254). Each of these components of the example input control system (232) is discussed below.

The command input device (240) may be a physical device adapted to facilitate providing instructions to electromagnetic interference emitting devices (224). To do so, the command input device (240) may include one or more surfaces (242) adapted to physically interact with the electromagnetic interference emitting devices (224). For example, the surfaces (242) may be rounded to simulate a human finger. The command input device (240) may be movable to engage a surface of an electromagnetic interference emitting device (224) with the surface (242) to, for example, actuate a mechanical input sensor such as pressing a button or touching a touch screen. Further, some electromagnetic interference emitting devices (224) may include input devices (e.g., touch sensitive screens) that receive commands via capacitive touches. As such, the surfaces (242) may include conductive materials that simulate the conductivity of a human finger.

Further, the command input device (240) may include any number of surfaces (242) (i.e., may include multiple surfaces). For example, the surfaces (242) may face opposing directions to enable the command input device (240) to mechanically actuate multiple mechanical input sensors of different electromagnetic interference emitting devices to provide instructions to the electromagnetic interference emitting devices (224, FIG. 2.2) above or below the command input system (240). Further, the surfaces (242) may face the same direction but may be laterally spaced apart to enable the example input control system (232) to input commands into multiple electromagnetic interference emitting devices (224) simultaneously. In addition, the surfaces (242) may be movable relative to one another to enable the example command input system (232) to input commands requiring multiple, simultaneous inputs.

The motors (250), rails (252), and/or support members (254) may provide additional degrees of freedom to the command input device (240). For example, the rails (252) may be aligned along orthogonal axes and slidably coupled to one another. Further, the command input device (240) may be slidably coupled to one of the rails (252). The above couplings may enable the command input device (240) to translate along the axes along which the rails (252) are aligned. There may be any number of rails (252) included within the example input control system (232). Further, the rails (252) may be aligned along non-orthogonal axes.

While the example input control system (232) has been illustrated as having three degrees of freedom aligned with each of the Cartesian axes, an input control system in accordance with one or more embodiments of the invention may have different numbers of degrees of freedom (e.g., 2 degrees, 4, degrees, 5 degrees, etc.) and the degrees of freedom may be aligned with different types of axes (e.g., cylindrical, spherical, etc.) without departing from the invention.

The motors (250) may provide power to slide the rails (252) along each other. For example, the motors (250) may provide rotational motion that is converted to linear motion. The motors (250) may be electrically powered and may include AC motors, DC motors, brushless motors, direct drive motors, linear motors, servo motors, stepper motors, synchronous motors, or any other type of motor. Each of the rails (252) may be coupled to one or more of the motors (250). While described with respect to motors (250), an input control system in accordance with embodiments of the invention may utilize different types of devices (i.e., devices other than motors) for translating, rotating, or otherwise changing the orientation and/or position of different components of the input control with respect to each other and/or with respect to electromagnetic interference emitting devices.

The support members (254) may be physical structures adapted to maintain the structural integrity of the input control system (230). The support members (254) may be statically coupled to one of the surfaces of the internal volume (214, FIG. 2.2) and to one or more of the rails (252) to maintain the position of the coupled rail (252). In embodiments with multiple support members (254), the support members (254) may be coupled to the same surface of the internal volume (214).

Thus, as illustrated in FIGS. 1.1-2.4, a system in accordance with embodiments of the invention may facilitate the inclusion and operation of numerous electromagnetic interference emitting devices in a high-density environment. Such electromagnetic interference emitting devices may be included for any purposes (e.g., testing, performing computations, etc.).

To further clarify aspects of embodiments of the invention, a method that may be performed in conjunction and/or separately from the system of FIG. 1.1 is illustrated in FIG. 3. The aforementioned method may be performed when providing electromagnetic interference management services.

FIG. 3 shows a flowchart of a method in accordance with one or more embodiments of the invention. The method depicted in FIG. 3 may be used to manage electromagnetic interference in accordance with one or more embodiments of the invention. The method shown in FIG. 3 may be performed completely, or in part, by, for example, data processing devices (e.g., 102, FIG. 1.1). Other components of the system illustrated in FIG. 1.1 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In Step 300, an electromagnetic interference state of the data processing device is obtained.

In one or more embodiments of the invention, the electromagnetic interference state of the data processing device is obtained based on data provided by the data processing device. For example, the data processing device may provide its electromagnetic interference state. The electromagnetic interference state may reflect the suppression of electromagnetic interference of the data processing device.

In one or more embodiments of the invention, the electromagnetic interference state is monitored using sensors. The sensors may be disposed where the electromagnetic interference state of the data processing device may be monitored. For example, the sensors may be disposed proximate to portions of the data processing device that may be actuated between two positions. When in a first of the two positions, the portion may be in a state (e.g., position and orientation) that reflects and/or attenuates electromagnetic radiation as it propagates through the portion of the data processing device. When in the second of the two positions, the portion may be in a second state that does not significantly reflect and/or attenuate electromagnetic radiation as it propagates through the portions of the data processing device. The sensors may be used to detect such states (e.g., positions/orientations) and the sensor data may be used to infer the electromagnetic interference suppression state of the data processing device. Any number of sensors may be used to monitor the physical state of any number of portions to determine the electromagnetic interference suppression state of the data processing device.

In one or more embodiments of the invention, the electromagnetic interference state reflects whether an internal volume of the data processing device that includes one or more electromagnetic interference emitting devices (and/or other types of devices) is electromagnetically closed. That is, whether the walls that bound the internal volume of the data processing device reflect and/or attenuate propagating electromagnetic radiation as the electromagnetic radiation propagates out of the internal volume by at least 90 decibels, or another suitable amount (e.g., attenuate by at least 35 decibels).

In Step 302, it is determined whether the electromagnetic interference state is an electromagnetic interference suppressed state.

If the electromagnetic interference state is not in the electromagnetic interference suppressed state, then the method returns to Step 300. Such a state may indicate that if electromagnetic interference emitting devices begin generating electromagnetic radiation, the electromagnetic radiation may propagate out of an internal volume and into an ambient environment (and/or other locations) surround the data processing device. Consequently, it may not be desirable to perform actions that cause the electromagnetic interference emitting devices to generate electromagnetic radiation when the data processing device is not in an electromagnetic interference suppressed state.

Further, if the electromagnetic interference state is not in the electromagnetic interference suppressed state, the electromagnetic interference state may be considered in an electromagnetic interference compromised state. For example, the electromagnetic interference compromised state may be caused by changing a configuration of the data processing device. A portion of the data processing device bounding the internal volume may be modified (e.g., translated, rotate, etc.) to open, electromagnetically and/or physically, the internal volume. In the electromagnetic interference suppression compromised state the data processing device may not isolate the internal volume by greater than 90 decibels from the ambient environment surrounding the data processing device. While in the electromagnetic interference compromised state, physical access to the electromagnetic interference emitting devices may be enabled due to the configuration change of the data processing device.

The internal volume may be an electromagnetic interference suppressed volume. An electromagnetic interference suppressed volume may be a volume that reduces the strength of electromagnetic interference that propagates from within the internal volume to outside of the internal volume by at least 90 decibels. The suppression factor (e.g., 90 decibels) may be different quantities (e.g., greater than 35 decibels) without departing from the invention. In one or more embodiments of the invention, the suppression factor is between 30-40 decibels. In one or more embodiments of the invention, the suppression factor is between 40-50 decibels. In one or more embodiments of the invention, the suppression factor is between 50-60 decibels. In one or more embodiments of the invention, the suppression factor is between 60-70 decibels. In one or more embodiments of the invention, the suppression factor is between 70-80 decibels. In one or more embodiments of the invention, the suppression factor is between 80-90 decibels. In one or more embodiments of the invention, the suppression factor is greater than 90 decibels.

In Step 304, an action set is performed via an input control system.

The action set may cause instructions to be provided to one or more electromagnetic interference emitting devices. For example, the action set may include mechanically actuating one or more mechanical input sensors of the one or more electromagnetic interference emitting devices.

To perform the action set, a computing device that operably controls the input control system may cause the input control system to mechanically actuate the one or more mechanical input sensors. For example, the computing device may operably control motors, or other actuators, that when controlled facilitate movement of portions of the input control system such that the portions cause the mechanical input sensors to be actuated.

When performing the action set, the electromagnetic interference emitting devices may be emitting electromagnetic interference (e.g., electromagnetic radiation). Such electromagnetic interference may be utilized by the electromagnetic interference emitting devices to provide their functionality (e.g., communicate with other devices, sense their environment, etc.). Prior to Step 304, the electromagnetic interference emitting devices may be prevented from emitting electromagnetic interference.

Performing the action set may cause one or more of the electromagnetic interference emitting devices to: (i) begin generating electromagnetic interference, (ii) terminate generation of electromagnetic interference, and/or (iii) change a type of electromagnetic interference being generated (e.g., communicate via other frequency bands, change data encoding protocols, etc.). Such changes may correspond to instructing the one or more data processing devices to perform different portions of their functionality. Consequently, performing the action set may enable, while maintaining the electromagnetic isolation of the electromagnetic interference emitting devices invoking different functionalities of the electromagnetic interference emitting devices.

In Step 306, it is determined whether the electromagnetic interference state has continued to be in an electromagnetic interference suppressed state. For example, the determination may be made while a portion of the action set of Step 304 has not yet been performed.

The determination of Step 306 may be performed in the same manner as the determination made in Step 302. Further, Step 306 may be performed continuously during the duration of Step 304. Step 306 may determine whether the electromagnetic interference emitting device has shifted to an electromagnetic interference compromised state, or Step 306 may determine whether the electromagnetic interference device is likely to or will shift to the electromagnetic interference compromised state. As such, Step 306 may be considered a proactive determination (e.g., a prediction of a future event), or a reactive determination (e.g., a determination based on past events).

The determination in Step 306 may be proactive by predicting future changes to the electromagnetic interference state. In one or more embodiments, the electromagnetic interference state changes according to a set schedule. As such, the schedule may be monitored and scheduled changes to the electromagnetic interference state may be monitored. In one or more embodiments, a user may, send via a computing device, a message including an upcoming change to the electromagnetic interference state.

Further, the predicted future changes to the electromagnetic interference state may be made using sensor data. For example, the sensor data may monitor a physical state of one or more components of the data processing device that, when it enters a predetermined state, is correlated with a future electromagnetic suppression state change.

For example, a sensor may monitor the position of a locking mechanism of a data processing device. The locking mechanism may have two physical states, one locked and the other unlocked. When in the locked state, the locking mechanism may prevent a portion of the data processing device from moving that would result in the electromagnetic interference state of the data processing device being in an electromagnetically compromised state. However, when in the unlocked state, the locking mechanism may only allow the portion of the data processing device to move which may, but not require, the movement to occur. Consequently, the second state may only be correlated with a likelihood of an electromagnetic interference state change rather than being causally related to an electromagnetic interference state change. Thus, in some embodiments of the invention, the predicted future change may be used to proactively modify the behavior of the data processing device even though a future electromagnetic interference state change is not guaranteed to occur.

In Step 308, if the electromagnetic interference state has shifted, will shift, or is likely to shift from the electromagnetic interference suppressed state to the electromagnetic interference compromised state, then the action set of Step 304 is suspended and the method reverts back to Step 300.

Suspending the action set may include suspending the operation of the electromagnetic interference emitting devices to cause the electromagnetic interference emitting devices to suspend emission of electromagnetic interference. For example, the control input systems may provide additional instructions to the electromagnetic interference emitting devices to suspend operation of the electromagnetic interference emitting devices.

In Step 310, it is determined whether performance of the action set is complete. If performance of the action set is not complete, the method may proceed to step 306. By doing so, continuous monitoring of the electromagnetic interference state of the data processing device may be facilitated while the action set is being performed. If performance of the action set is complete, the method may end following step 310.

Thus, via the method illustrated in FIG. 3, electromagnetic interference emitting devices disposed within a data processing device may be operated while reducing the likelihood of electromagnetic interference impacting the operation of devices disposed proximate to the data processing device.

Figure 4:
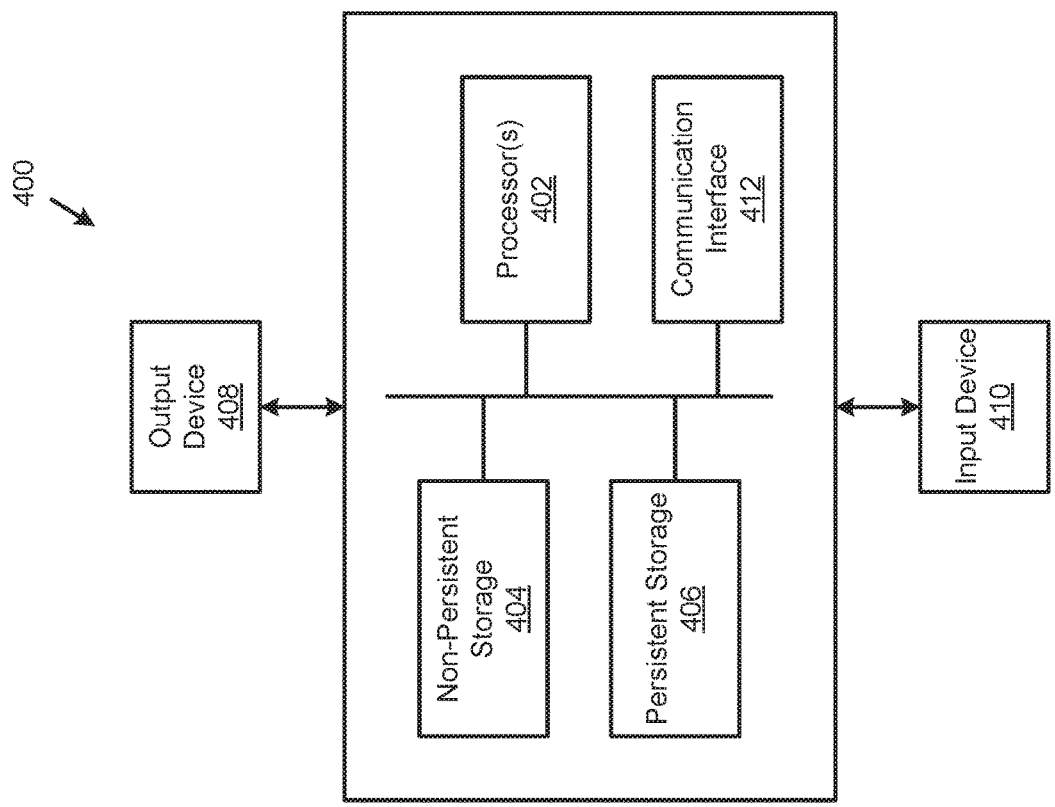
FIG. 4 shows diagram of a computing device in accordance with one or more embodiments of the invention.

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such a device may include functionality to limit the propagation of electromagnetic interference from within data processing devices to an ambient environment surrounding the data processing device. By doing so, such data processing devices may be used in a high-density environment without negatively impacting the functionality of the high-density environment.

Additional embodiments of the invention may facilitate the use of mechanical input sensors of devices disposed within data processing devices. To do so, a data processing device in accordance with one or more embodiments of the invention may include an input control system that mechanically actuates the mechanically input sensors of the devices while disposed in electromagnetic interference isolated volumes of the data processing devices. By doing so, the functionality of the devices may be invoked, as may be invoked by users of the devices, while maintaining the isolation of the devices.

Thus, embodiments of the invention may address the problem of electromagnetic interference within a high-density environment from devices that have their functionality invoked via mechanical input. Specifically, embodiments of the invention may provide data processing devices that allow for the aforementioned functionality of the devices to be invoked while maintaining electromagnetic isolation of the aforementioned devices.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A system for providing electromagnetic interference (EMI) suppression, comprising:
    a data processing device comprising:
        a payload module adapted to suppress EMI from an internal volume to an ambient environment by greater than 90 decibels;
        the internal volume adapted to house EMI emitting devices that generate EMI; and
        an input control system, disposed within the internal volume, wherein the input control system comprises a command input device translatable along axes and adapted to mechanically input commands into the EMI emitting devices.

2. The system of claim 1, wherein the input control system further comprises:
a plurality of rails aligned with the axes; and
at least two rails of the plurality of rails are slidably coupled to one another,
wherein the command input device is fixedly coupled to one of the rails of the plurality of rails.

3. The system of claim 1, wherein the command input device comprises:
first and second surfaces facing opposite directions, and each of the first surface and the second surface is adapted to provide a tactile input into the EMI emitting devices.

4. The system of claim 3, wherein the EMI emitting devices are disposed on opposing sides of the internal volume, and the input control system is disposed between the opposing sides, and each of the first surface and the second surface face one of the opposing sides.

5. The system of claim 1, wherein the payload module is adapted to dispose the EMI emitting devices on opposing sides of the internal volume, and the input control system is disposed between the opposing sides.

6. The system of claim 1, further comprising:
a support module separate from the internal volume; and
the input control system further comprises a controller, disposed within the support module, configured to control translation of the command input device to mechanically input the commands into the EMI emitting devices.

7. The system of claim 1, wherein the data processing device further comprises:
a front vent adapted to suppress the EMI from the internal volume to the ambient environment by greater than 90 decibels.

8. The system of claim 6, wherein the data processing device further comprises:
a rear vent adapted to suppress the EMI from the internal volume to the ambient environment by greater than 90 decibels.

9. The system of claim 6, wherein the front vent is adapted to rotate from a first position that electromagnetically seals the internal volume to a second position that:
electromagnetically opens the internal volume; and
enables physical access to the internal volume.

10. The system of claim 1, wherein the EMI emitting devices are personal electronic devices.

11. The system of claim 9, wherein the personal electronic devices comprise a cell phone.

12. The system of claim 1, further comprising at least one selected from a group consisting of a camera, a thermal sensor, and a strain gauge, wherein the at least one is coupled to the command input device.

13. The system of claim 1, further comprising a controller programmed to:
automatically suspend operation of the EMI emitting devices in response to a determination that the internal volume will shift from an EMI suppressed state that suppresses the EMI from the internal volume to the ambient environment by greater than 90 decibels to an EMI compromised state that does not suppress the EMI from the internal volume to the ambient environment by greater than 90 decibels.

14. The system of claim 1, further comprising a controller programmed to:
automatically suspend operation of the EMI emitting devices in response to a determination that the internal volume has shifted from an EMI suppressed state that suppresses the EMI from the internal volume to the ambient environment by greater than 90 decibels to an EMI compromised state that does not suppress the EMI from the internal volume to the ambient environment by greater than 90 decibels.

15. A method for managing electromagnetic interference (EMI), comprising:
operating EMI emitting devices that emit EMI during operation while disposed in an EMI suppressed internal volume of a data processing device;
making a determination that the internal volume is in an EMI suppressed state;
based on the determination, performing an action set comprising:
inputting commands into the EMI emitting devices via a command input device positioned in the EMI suppressed internal volume while the EMI emitting devices are emitting EMI,
wherein the command input device is adapted to input the commands via mechanical actuation.

16. The method of claim 15, wherein the mechanical actuation comprises a tactile interaction between the command input device and an EMI emitting device of the EMI emitting devices.

17. The method of claim 15, further comprising:
making a second determination, while performing the action set, that the EMI suppressed internal volume will shift from the EMI suppressed state to an EMI compromised state; and
in response to the second determination:
suspending the performance of the action set; and
suspending the operation of the EMI emitting devices to cause the EMI emitting devices to suspend emission of EMI.

18. The method of claim 15, further comprising:
making a second determination, while performing the action set, that the EMI suppressed internal volume has shifted from the EMI suppressed state to an EMI compromised state; and
in response to the second determination:
suspending the performance of the action set; and
suspending the operation of the EMI emitting devices to cause the EMI emitting devices to suspend emission of EMI.

19. The method of claim 15, wherein the mechanical actuation comprises translating the command input device along axes to input commands into the EMI emitting devices.

20. The method of claim 15, further comprising:
making a second determination, while performing the action set, that the EMI suppressed internal volume remains in the EMI suppressed state; and
in response to the second determination, continuing the performance of the action set.

* * * * *